(12) United States Patent
Noh et al.

(10) Patent No.: US 10,782,580 B2
(45) Date of Patent: Sep. 22, 2020

(54) ARRAY SUBSTRATE, LIQUID CRYSTAL DISPLAY DEVICE HAVING THE SAME, AND METHOD FOR MANUFACTURING ARRAY SUBSTRATE

(71) Applicant: Samsung Display Co., Ltd., Yongin-si, Gyeonggi-do (KR)

(72) Inventors: Jung Hun Noh, Yongin-si (KR); Keun Kyu Song, Seongnam-si (KR); Hyun Sup Lee, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 39 days.

(21) Appl. No.: 15/242,278

(22) Filed: Aug. 19, 2016

(65) Prior Publication Data

US 2017/0315392 A1    Nov. 2, 2017

(30) Foreign Application Priority Data

Apr. 29, 2016  (KR) .................. 10-2016-0053084

(51) Int. Cl.
| | |
|---|---|
| *G02F 1/1368* | (2006.01) |
| *H01L 27/12* | (2006.01) |
| *G02F 1/1343* | (2006.01) |
| *G02F 1/1333* | (2006.01) |
| *H01L 29/786* | (2006.01) |
| *G02F 1/1335* | (2006.01) |

(52) U.S. Cl.
CPC ...... *G02F 1/1368* (2013.01); *G02F 1/133345* (2013.01); *G02F 1/133512* (2013.01); *G02F 1/133514* (2013.01); *G02F 1/134327* (2013.01); *H01L 27/1225* (2013.01); *H01L 29/7869* (2013.01); *H01L 29/78642* (2013.01); *G02F 2001/134318* (2013.01); *G02F 2201/121* (2013.01); *G02F 2201/123* (2013.01); *G02F 2201/40* (2013.01)

(58) Field of Classification Search
CPC ............ G02F 1/1368; G02F 1/133345; G02F 1/136227; H05K 2201/10053; H01L 29/78642
See application file for complete search history.

(56) References Cited

U.S. PATENT DOCUMENTS

| | | | |
|---|---|---|---|
| 3,986,199 A | | 10/1976 | Williams |
| 4,547,789 A | * | 10/1985 | Cannella ................. H01L 29/04 257/57 |
| 4,924,279 A | * | 5/1990 | Shimbo ............. H01L 29/78642 257/58 |

(Continued)

FOREIGN PATENT DOCUMENTS

| | | |
|---|---|---|
| JP | 2000-196104 A | 7/2000 |
| KR | 10-0176179 A | 3/1999 |
| KR | 10-2005-0001936 A | 1/2005 |

*Primary Examiner* — Edmond C Lau
*Assistant Examiner* — Jonathan Y Jung
(74) *Attorney, Agent, or Firm* — Innovation Counsel LLP

(57) ABSTRACT

An array substrate includes a first substrate, a source electrode disposed on the first substrate, a semiconductor pattern layer disposed on the source electrode, a drain electrode disposed on the semiconductor pattern layer, a pixel electrode disposed on the drain electrode and a gate electrode disposed on at least one side surface of the semiconductor pattern layer. A method of making the solar panel is provided. A method of making the array substrate is provided.

11 Claims, 10 Drawing Sheets

(56) References Cited

U.S. PATENT DOCUMENTS

| | | | |
|---|---|---|---|
| 7,923,780 B2 * | 4/2011 | Hirakata | H01L 27/1214 257/347 |
| 2007/0247557 A1 * | 10/2007 | Yeo | G02F 1/136286 349/43 |
| 2009/0230383 A1 | 9/2009 | Meng et al. | |
| 2010/0133539 A1 * | 6/2010 | Kang | H01L 27/12 257/59 |
| 2011/0101337 A1 * | 5/2011 | Yamazaki | H01L 27/1225 257/43 |
| 2011/0101355 A1 * | 5/2011 | Yamazaki | H01L 27/1225 257/59 |
| 2011/0204370 A1 * | 8/2011 | Yoon | H01L 27/1214 257/59 |
| 2014/0319530 A1 * | 10/2014 | Chung | G02F 1/1362 257/72 |
| 2015/0021630 A1 * | 1/2015 | Jang | G02F 1/136227 257/88 |
| 2015/0076495 A1 * | 3/2015 | Miyairi | H01L 29/78642 257/43 |

* cited by examiner

ARRAY SUBSTRATE, LIQUID CRYSTAL DISPLAY DEVICE HAVING THE SAME, AND METHOD FOR MANUFACTURING ARRAY SUBSTRATE

CROSS-REFERENCE TO RELATED APPLICATION

This application claims priority to Korean Patent Application No. 10-2016-0053084 filed on Apr. 29, 2016 in the Korean Intellectual Property Office, the disclosure of which is incorporated herein by reference in its entirety.

BACKGROUND

1. Technical Field

The present inventive concept relates to an array substrate, a liquid crystal display device having the same, and a method for manufacturing an array substrate.

2. Description of the Related Art

The importance of display devices is increasing along with the development of multimedia. Accordingly, various kinds of display devices such as liquid crystal displays (LCDs), organic light emitting displays (OLEDs) and the like are being widely used.

A liquid crystal display (LCD) is presently one of the most widely used flat panel display devices, and includes two substrates having electric field generating electrodes such as pixel electrodes and a common electrode formed thereon, and a liquid crystal layer interposed between the two substrates. An LCD is configured in that a voltage is applied to the electric field generating electrodes so as to generate an electric field in the liquid crystal layer, which thus determines the orientation of liquid crystal molecules of the liquid crystal layer and controls the polarization of incident light, thereby displaying desired images.

Meanwhile, as the resolution of a display device becomes high, the number of pixels disposed in a display region having the same area relatively increases. To drive each pixel, at least one thin film transistor needs to be provided in each pixel, but the thin film transistor is formed on a light-blocking region covered by a light shield member, and thus may not allow light to pass therethrough. That is to say, as the size of the light-blocking region becomes larger in one pixel, an aperture ratio decreases, resulting in a degraded image quality in the display device.

The ratio of the area occupied by the thin film transistor in the pixel relatively increases as the resolution becomes high, which mainly causes a decrease in aperture ratio. Therefore, various technical attempts have been made to reduce the ratio of the area occupied by the thin film transistor, and thus to increase aperture ratio.

SUMMARY

An embodiment of the present inventive concept provides an array substrate including pixels with high aperture ratio.

Another embodiment of the present inventive concept provides an array substrate including thin film transistors with stable electrical characteristics.

Still another embodiment of the present inventive concept provides an array substrate suitable for a high resolution display device.

Still another embodiment of the present inventive concept provides a liquid crystal display device with high aperture ratio.

Still another embodiment of the present inventive concept provides a liquid crystal display device including thin film transistors with stable electrical characteristics.

Still another embodiment of the present inventive concept provides a liquid crystal display device suitable for a high resolution display device.

Still another embodiment of the present inventive concept provides a method for manufacturing an array substrate including pixels with high aperture ratio.

Still another embodiment of the present inventive concept provides a method for manufacturing an array substrate including thin film transistors with stable electrical characteristics.

Still another embodiment of the present inventive concept provides a method for manufacturing an array substrate suitable for a high resolution display device.

However, embodiments of the present inventive concept are not restricted to those set forth herein. The other embodiments of the present inventive concept which are not mentioned herein will become more apparent to a person skilled in the art to which the present inventive concept pertains by referencing the detailed description of the present inventive concept given below.

According to an aspect of the present inventive concept, there is provided an array substrate including a first substrate, a source electrode disposed on the first substrate, a semiconductor pattern layer disposed on the source electrode, a drain electrode disposed on the semiconductor pattern layer, a pixel electrode disposed on the drain electrode, and a gate electrode disposed on at least one side surface of the semiconductor pattern layer.

The source electrode, the semiconductor pattern layer, and the drain electrode may be overlapped in a plan view.

The gate electrode may be overlapped with the source electrode, the semiconductor pattern layer, and the drain electrode in a horizontal direction.

The pixel electrode may be overlapped with the semiconductor pattern layer in a plan view.

The semiconductor pattern layer may include an oxide semiconductor.

The array substrate may further include a channel which electrically interconnects the source electrode and the drain electrode, and the channel may be formed in the semiconductor pattern layer adjacent to the gate electrode.

A bottom end of the gate electrode may be disposed below an upper surface of the source electrode, and a top end of the gate electrode may be disposed above a lower surface of the drain electrode.

The array substrate may further include a first insulation layer which covers the source electrode, the semiconductor pattern layer, and the drain electrode, and a thickness of the first insulation layer may be thinner than a thickness of the source electrode.

The gate electrode may further include a second gate electrode, the second gate electrode being disposed on the other side of the semiconductor pattern layer.

The gate electrode may include a hollow portion and a rim portion disposed outside the hollow portion, and the rim portion may be disposed along an outer rim of the drain electrode.

At least one insulation layer having a contact hole for exposing a surface of the drain electrode may be disposed on the drain electrode, and the pixel electrode may be disposed on the exposed surface of the drain electrode.

A portion of the pixel electrode and the rim portion of the gate electrode may be overlapped with each other in a plan view.

One sidewall of the source electrode, the semiconductor pattern layer, and the drain electrode may be aligned with each other.

According to an aspect of the present inventive concept, there is provided a date line and a gate line intersecting each other, a source electrode, a semiconductor pattern layer and a drain electrode sequentially stacked on a first substrate, wherein the source electrode is branched off from the data line, a first gate electrode disposed on one side surface of the semiconductor pattern layer with a gate insulating layer disposed between the first gate electrode and the semiconductor pattern layer, wherein the first gate electrode is extended from the gate line, a passivation layer on the first gate electrode, a pixel electrode connected to the drain electrode, a second substrate facing the first substrate, and a liquid crystal layer dispose between the first substrate and the second substrate.

At least one edge of the semiconductor pattern layer may be covered by the first gate electrode in a plan view.

At least one edge of the drain electrode may be covered by the first gate electrode in a plan view.

The first gate electrode may overlap one edge of the source electrode which extends parallel to the at least one edge of the drain electrode, the at least one edge of the drain electrode and the at least one edge of the semiconductor pattern layer in a plan view.

The liquid crystal display device may further include a second gate electrode parallel to the first gate electrode with the drain electrode interposed between the first gate electrode and the second gate electrode, wherein the second gate electrode may be extended from the gate line and overlaps an opposing edge of the semiconductor pattern layer which is opposite to the at least one edge of the semiconductor pattern layer in a plan view.

The first gate electrode may comprise a rim portion and a hollow portion, wherein the rim portion may be disposed along an outer boundary of the drain electrode in a plan view.

The hollow portion may be disposed substantially at a center of the first gate electrode, and wherein the pixel electrode may be connected to the drain electrode through the hollow portion in a plan view.

Other specific details of the embodiments of the present inventive concept are described below with reference to the drawings in the detailed description.

The embodiments of the present inventive concept may at least provide effects described below.

Each pixel in an array substrate may have improved aperture ratio.

A horizontal area occupied by thin film transistors in each pixel in an array substrate may be reduced.

An array substrate suitable for a high resolution display device may be provided.

However, effects of the present inventive concept are not restricted to the exemplary embodiments set forth herein and more diverse effects are included in this description.

DETAILED DESCRIPTION OF THE EMBODIMENTS

Figure 1:
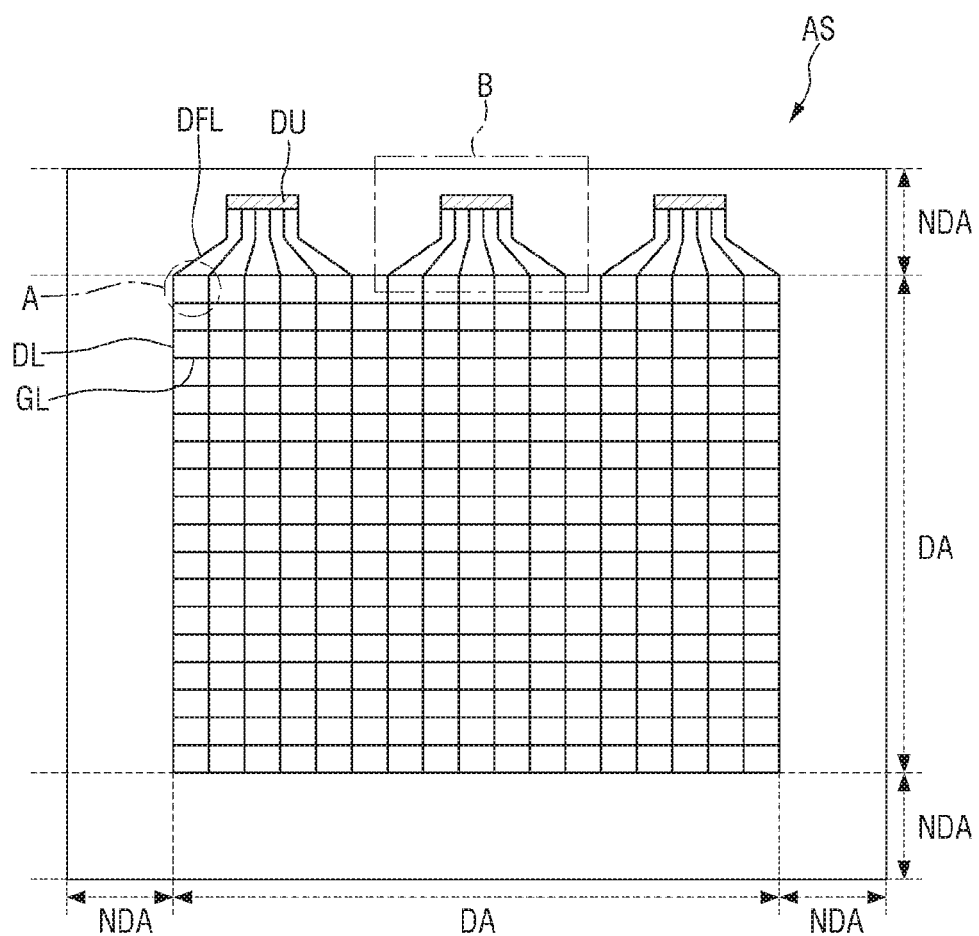
FIG. 1 is a schematic plan view illustrating an array substrate according to an exemplary embodiment of the present inventive concept.

The aspects and features of the present inventive concept and methods for achieving the aspects and features will be apparent by referring to the embodiments to be described in detail with reference to the accompanying drawings. However, the present inventive concept is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the inventive concept, and the present inventive concept is only defined within the scope of the appended claims.

The term "on" that is used to designate that an element is on another element or located on a different layer or a layer includes both a case where an element is located directly on another element or a layer and a case where an element is located on another element via another layer or still another element. In the entire description of the present inventive concept, the same drawing reference numerals are used for the same elements across various figures.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

Hereinafter, preferred embodiments of the present inventive concept will be described in detail with reference to the attached drawings.

Figure 2:
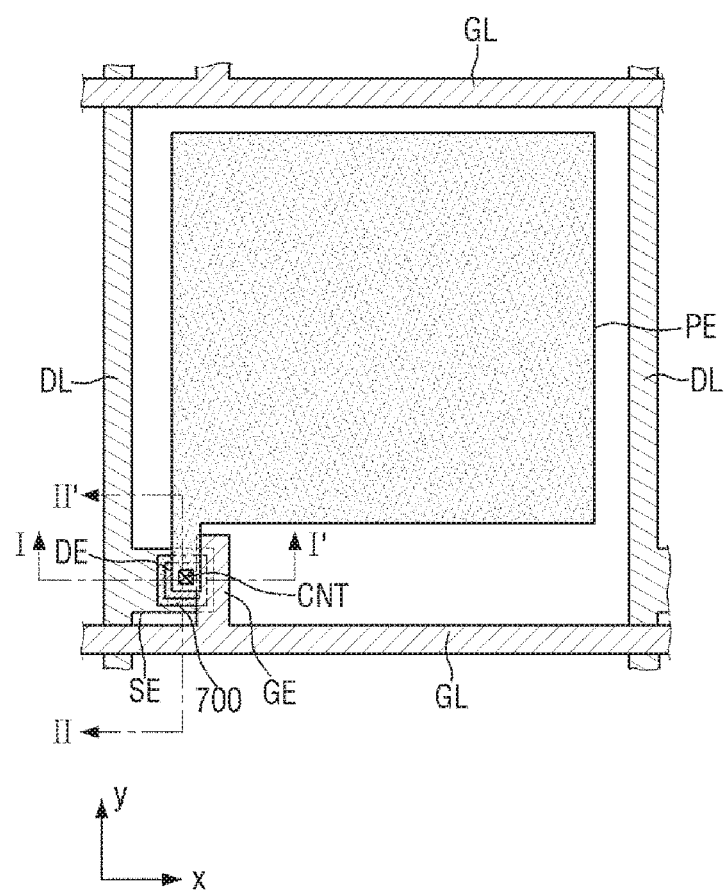
FIG. 2 is an enlarged view of portion A of FIG. 1.
Figure 3:
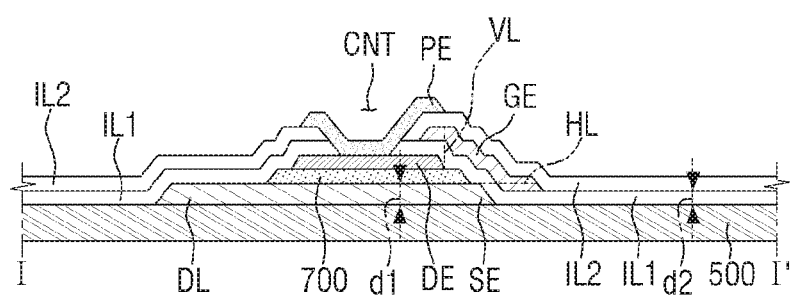
FIG. 3 is a cross-sectional view taken along line I-I' of FIG. 2.
Figure 4:
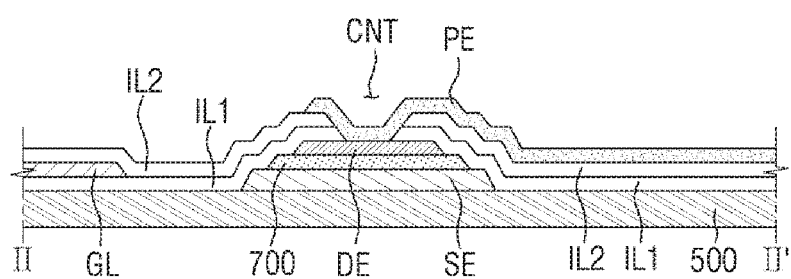
FIG. 4 is a cross-sectional view taken along line II-II' of FIG. 2.

FIG. 1 is a schematic plan view illustrating an array substrate AS according to an exemplary embodiment of the present inventive concept. FIG. 2 is an enlarged view of portion A of FIG. 1. FIG. 3 is a cross-sectional view taken along line I-I' of FIG. 2. FIG. 4 is a cross-sectional view taken along line II-II' of FIG. 2.

Referring to FIG. 1 to FIG. 4, an array substrate AS according to an exemplary embodiment of the present inventive concept may include a first substrate 500, a source electrode SE disposed on the first substrate 500, a semiconductor pattern layer 700 disposed on the source electrode SE, a drain electrode DE disposed on the semiconductor pattern layer 700, a pixel electrode PE disposed on the drain electrode DE, and a gate electrode GE disposed on at least one side surface of the semiconductor pattern layer 700.

The first substrate 500 may be made of a heat-resistant and light transmitting material. The first substrate 500 may be made of, for example, transparent glass or plastic, but the present disclosure is not limited thereto. A display area DA and a non-display area NDA are defined on the first substrate 500.

The display area DA displays images in a display device, and the non-display area NDA has various signal lines disposed therein so as to enable the display area DA to display images.

The non-display area NDA may have a plurality of data drivers DU disposed therein so as to provide data signals to data lines DL, and a plurality of data fan-out lines DFL disposed therein so as to deliver the signals provided from the data drivers DU to the data lines DL.

A plurality of pixels defined by the plurality of data lines DL and gate lines GL intersecting each other may be disposed in the display area DA. FIG. 2 is an enlarged view of one pixel (part A of FIG. 1) among the plurality of pixels, and the display area DA may include a plurality of pixels substantially the same as the one pixel.

Referring to FIG. 2, the data line DL and the source electrode SE may be disposed on the first substrate 500. The data line DL may extend in a first direction, for example, y-axis direction in FIG. 2, and intersect the gate line GL, which will be described later. The source electrode SE may be branched off from the data line DL. That is, the source electrode SE may be formed integrally with the data line DL. The source electrode SE may extend in a second direction intersecting the first direction, for example, x-axis direction in FIG. 2. Furthermore, the source electrode SE may be at least partially overlapped with the semiconductor pattern layer 700, which will be described later.

The data line DL and the source electrode SE may have a single layer structure or a multi-layer structure which comprises nickel (Ni), cobalt (Co), titanium (Ti), silver (Ag), copper (Cu), molybdenum (Mo), aluminum (Al), beryllium (Be), niobium (Nb), gold (Au), iron (Fe), selenium (Se), tantalum (Ta) or the like. Furthermore, an alloy made of the above-enumerated metals and one or more elements selected from the group consisting of titanium (Ti), zirconium (Zr), tungsten (W), tantalum (Ta), niobium (Nb), platinum (Pt), hafnium (Hf), oxygen (O) and nitrogen (N) can also be used. However, the above-enumerated materials are merely exemplary, and the materials of the data line DL and source electrode SE are not limited thereto.

The semiconductor pattern layer 700 may be disposed on the data line DL and/or the source electrode SE. The semiconductor pattern layer 700 may be at least partially overlapped with the source electrode SE. For example, an outer side surface of the semiconductor pattern layer 700 may be disposed inwardly relative to an outer side surface of the source electrode SE in a plan view. That is, the semiconductor pattern layer 700 may be disposed on the source electrode SE so as to be completely overlapped with the source electrode SE in a plan view.

The semiconductor pattern layer 700 may have various shapes such as an island or a line. When the semiconductor pattern layer 700 is formed into a line shape, the semiconductor pattern layer 700 may be disposed on the data line DL and extend below the gate electrode GE, which will be described later.

For example, the semiconductor pattern layer 700 may be patterned into the shape substantially the same as those of the data line DL and the source electrode SE. In other words, the semiconductor pattern layer 700 may be patterned into the shape substantially the same as those of the data line DL and the source electrode SE in the whole area. That is, the semiconductor pattern layer 700, the data line DL and source electrode SE may be simultaneously or sequentially formed by using one mask.

An ohmic contact layer (not shown), which is highly doped with n-type impurities, may be disposed on the semiconductor pattern layer 700. The ohmic contact layer may be disposed on a whole or a part of the semiconductor pattern layer 700. However, in an exemplary embodiment where the semiconductor pattern layer 700 includes an oxide semiconductor, the ohmic contact layer may be omitted.

If the semiconductor pattern layer 700 includes an oxide semiconductor, the semiconductor pattern layer 700 may include zinc oxide (ZnO). Furthermore, the semiconductor pattern layer 700 may be doped with one or more ions selected from the group consisting of gallium (Ga), indium (In), stannum (Sn), zirconium (Zr), hafnium (Hf), cadmium (Cd), silver (Ag), copper (Cu), germanium (Ge), gadolinium (Gd), titanium (Ti), and vanadium (V). For example, the semiconductor pattern layer 700 including an oxide semiconductor may include one or more materials selected from the group consisting of ZnO, ZnGaO, ZnInO, ZnSnO, GaInZnO, CdO, InO, GaO, SnO, AgO, CuO, GeO, GdO, HfO, TiZnO, InGaZnO, and InTiZnO. However, this is merely exemplary, and the type of the oxide semiconductor is not limited thereto.

In an exemplary embodiment, the semiconductor pattern layer 700 may include a low temperature polycrystalline silicon (LTPS) semiconductor or a-Si semiconductor. That is, the type of the semiconductor of the semiconductor pattern layer 700 is not limited thereto.

For convenience of explanation, some terms will now be defined. The expression "being overlapped in a horizontal direction" as used herein may mean that two or more components are at least partially overlapped with each other when viewed in the direction parallel to the upper surface of the first substrate 500.

The drain electrode DE may be disposed on the semiconductor pattern layer 700. The drain electrode DE may be overlapped with the semiconductor pattern layer 700. For example, an outer side surface of the drain electrode DE may be disposed inwardly relative to the outer side surface of the semiconductor pattern layer 700 in a plan view. In other words, the drain electrode DE may be completely overlapped with the semiconductor pattern layer 700 in a plan view. However, the present disclosure is not limited thereto, and the drain electrode DE may be partially overlapped with the semiconductor pattern layer 700 in a plan view. When the drain electrode DE is overlapped with the semiconductor pattern layer 700, the drain electrode DE may also be overlapped with the source electrode SE in a plan view. That is, the source electrode SE, the semiconductor pattern layer

700 and the drain electrode DE which are sequentially disposed may be at least partially overlapped in a plan view. In other words, the source electrode SE and the drain electrode DE may be overlapped with each other in a plan view with the semiconductor pattern layer 700 disposed therebetween.

The drain electrode DE may have a single layer structure or a multi-layer structure which comprises nickel (Ni), cobalt (Co), titanium (Ti), silver (Ag), copper (Cu), molybdenum (Mo), aluminum (Al), beryllium (Be), niobium (Nb), gold (Au), iron (Fe), selenium (Se), tantalum (Ta) or the like. Furthermore, an alloy made of the above-enumerated metals and one or more elements selected from the group consisting of titanium (Ti), zirconium (Zr), tungsten (W), tantalum (Ta), niobium (Nb), platinum (Pt), hafnium (Hf), oxygen (O) and nitrogen (N) can also be used. The drain electrode DE may be made of a material substantially the same as those of the data line DL and the source electrode SE described above.

Referring to FIG. 3, a first insulation layer IL1 may be disposed on the data line DL, the source electrode SE, the semiconductor pattern layer 700 and the drain electrode DE. The first insulation layer IL1 may be formed over the whole area of the first substrate 500, covering the data line DL, the source electrode SE, the semiconductor pattern layer 700 and the drain electrode DE.

The first insulation layer IL1 may be made of one or more materials including an inorganic insulation material such as silicon oxide (SiOx) and silicon nitride (SiNx), and an organic insulation material such as benzocyclobutene (BCB), an acrylic material, and polyimide. However, this is merely exemplary, and the material of the first insulation layer IL1 is not limited thereto.

The first insulation layer IL1 may have a thickness (hereinafter, referred to as a second thickness d2) relatively thinner than a thickness (hereinafter, referred to as a first thickness d1) of the source electrode SE (see FIG. 3). In other words, an upper surface of the first insulation layer IL1 disposed at both sides of the source electrode SE may be relatively lower than the upper surface of the source electrode SE. When the second thickness d2 is thinner than the first thickness d1 as described above, a lower surface of the other end of the gate electrode GE, which will be described later, may be disposed relatively lower than the upper surface of the source electrode SE. In this case, the source electrode SE may be at least partially overlapped with the gate electrode GE, which will be described later, in a horizontal direction.

More specifically, when the source electrode SE, the semiconductor pattern layer 700, and the drain electrode DE are sequentially stacked in a plan view so as to form a part of a thin film transistor, a channel Ch of the thin film transistor may be formed in the semiconductor pattern layer 700 adjacent to the gate electrode GE. When the channel Ch is formed in the semiconductor pattern layer 700, the source electrode SE and the drain electrode DE need to be overlapped with the gate electrode GE in a horizontal direction so as to maintain stable electrical characteristics of the thin film transistor. Therefore, when the second thickness d2 of the first insulation layer IL1 is thinner than the first thickness d1 of the source electrode SE as described above, the gate electrode GE disposed on the first insulation layer IL1 and the source electrode SE may be at least partially overlapped with each other in a horizontal direction, and thus the thin film transistor can maintain stable electrical characteristics.

Gate lines GL and GE may be disposed on the first insulation layer IL1. The gate lines GL and GE may include the gate line GL for receiving driving signals, and the gate electrode GE protruding from the gate line GL to overlap the semiconductor pattern layer 700.

The gate lines GL and GE may include aluminum (Al)-based metal including an aluminum alloy, silver (Ag)-based metal including a silver alloy, copper (Cu)-based metal including a copper alloy, molybdenum (Mo)-based metal including a molybdenum alloy, chrome (Cr), titanium (Ti), and tantalum (Ta). However, this is merely exemplary and the materials of the gate lines GL and GE are not limited thereto, and metal or polymer materials with required conductivity for implementing a desired display device can be used as materials of the gate lines GL and GE.

The gate lines GL and GE may have a single layer structure, but the present disclosure is not limited thereto and the gate lines GL and GE may have a multi-layer structure which includes a double layer structure and a triple layer structure.

The gate line GL may extend in the second direction, for example, x-axis direction in FIG. 2.

The gate electrode GE may extend in the first direction from the gate line GL. The gate electrode GE, together with the source electrode SE and the drain electrode DE, may form three terminals of the thin film transistor.

More specifically, the gate electrode GE may be disposed to be insulated from the source electrode SE, the drain electrode DE and the semiconductor pattern layer 700. That is, the first insulation layer IL1 may be interposed between the gate electrode GE and the source electrode SE, between the gate electrode GE and the drain electrode DE and between the gate electrode GE and the semiconductor pattern layer 700.

The gate electrode GE may be disposed on at least one side surface of the semiconductor pattern layer 700. In an exemplary embodiment of the present invention, the gate electrode GE is disposed to face at least the one side surface of the semiconductor pattern layer 700 which is not covered by the drain electrode DE. For example, as shown FIG. 3, the gate electrode GE may be disposed between a first line VL and a second line HL. The first line VL is a virtual line which is perpendicular to a boundary of the drain electrode DE and the second line HL is a virtual line which is horizontally extended from a bottom surface of the semiconductor pattern layer 700. In another exemplary embodiment of the present invention, the gate electrode GE may be disposed on at least one side surface of the source electrode SE, the semiconductor pattern layer 700, and the drain electrode DE which are stacked in a plan view. Thus, the gate electrode GE may be at least partially overlapped with the drain electrode DE, the semiconductor pattern layer 700, and the source electrode SE in a horizontal direction. That is, under the assumption that there is a virtual extended surface formed by extending a lower surface of the drain electrode DE in a horizontal direction, one end of the gate electrode GE may be disposed above the virtual extended surface and the other end of the gate electrode GE may be disposed below the virtual extended surface. When the source electrode SE, the semiconductor pattern layer 700, and the drain electrode DE are sequentially stacked in a plan view, the first insulation layer IL1 disposed along one side surface of the source electrode SE, the semiconductor pattern layer 700, and the drain electrode DE may have an inclined surface or a stepped surface, and the gate electrode GE may be disposed on the inclined surface. In other words, when the gate electrode GE is disposed along the inclined surface, the bottom end of the gate electrode GE may be disposed below the upper surface of the source electrode SE, and the top end of the gate electrode GE may be disposed above the lower surface of the drain electrode DE. However, the top end of the gate electrode GE may be disposed above the upper surface of the drain electrode DE in a horizontal direction. When the gate electrode GE, the source electrode SE, the semiconductor pattern layer 700, and the drain electrode DE are arranged in such a configuration, the gate electrode GE may be at least partially overlapped with the source electrode SE and the drain electrode DE in a horizontal direction as described above (see FIG. 3 and FIG. 8).

In this case, the channel Ch of the thin film transistor may be formed in semiconductor pattern layer 700 adjacent to the gate electrode GE. That is, when turn-on voltage is applied to the gate electrode GE, the channel Ch may be formed in the semiconductor pattern layer 700 adjacent to the gate electrode GE.

A second insulation layer IL2 may be disposed on the gate electrode GE. The second insulation layer IL2 may be made of one or more materials selected from the group consisting of an inorganic insulation material such as silicon oxide (SiOx) and silicon nitride (SiNx), and an organic insulation material such as benzocyclobutene (BCB), an acrylic material, and polyimide. However, this is merely exemplary, and the material of the second insulation layer IL2 is not limited thereto. For example, the second insulation layer IL2 may be made of a material substantially the same as that of the first insulation layer IL1.

A contact hole CNT may be formed through the first insulation layer IL1 and the second insulation layer IL2 to expose an upper surface of the drain electrode DE. The contact hole CNT may at least partially expose the upper surface of the drain electrode DE. In other words, the contact hole CNT may formed through the first insulation layer IL1 and the second insulation layer IL2 on the drain electrode DE so as to at least partially expose the drain electrode DE. The contact hole CNT may be formed to expose a center of the drain electrode DE and not to expose the side surface of the drain electrode DE.

The pixel electrode PE may be disposed on the drain electrode DE. The pixel electrode PE may be electrically connected to the drain electrode DE through the contact hole CNT formed through the first insulation layer IL1 and the second insulation layer IL2. In this case, the pixel electrode PE may be partially overlapped with the source electrode SE, the semiconductor pattern layer 700, and the drain electrode DE in a plan view. In an exemplary embodiment, the pixel electrode PE may be made of a transparent conductor such as indium tin oxide (TIN) or indium zinc oxide (IZO), or a reflective conductor such as aluminum.

Although the pixel electrode PE shown in FIG. 2 has a plate shape, the shape of the pixel electrode PE is not limited thereto. That is, in another exemplary embodiment, the pixel electrode PE may have one or more slits. In still another exemplary embodiment, one or more pixel electrodes may be disposed, and in this case, voltages different from each other may be applied to the plurality of pixel electrodes, respectively.

When the source electrode SE, the semiconductor pattern layer 700, and the drain electrode DE are sequentially disposed in a plan view as described above, the horizontal area occupied by the thin film transistor in the whole pixel may decrease. That is, the thin film transistor can be disposed by using a horizontal area relatively smaller than when the source electrode SE and the drain electrode DE are disposed in a horizontal direction on the same plane. Thus, when the horizontal area occupied by a thin film transistor in a pixel is relatively decreased, an aperture ratio of the pixel may relatively increase.

An array substrate AS according to another exemplary embodiment of the present inventive concept will now be described. In the exemplary embodiment described below, identical reference numerals denote identical elements which have already been described, and a duplicated description will be omitted or only a brief description will be given.

Figure 5:
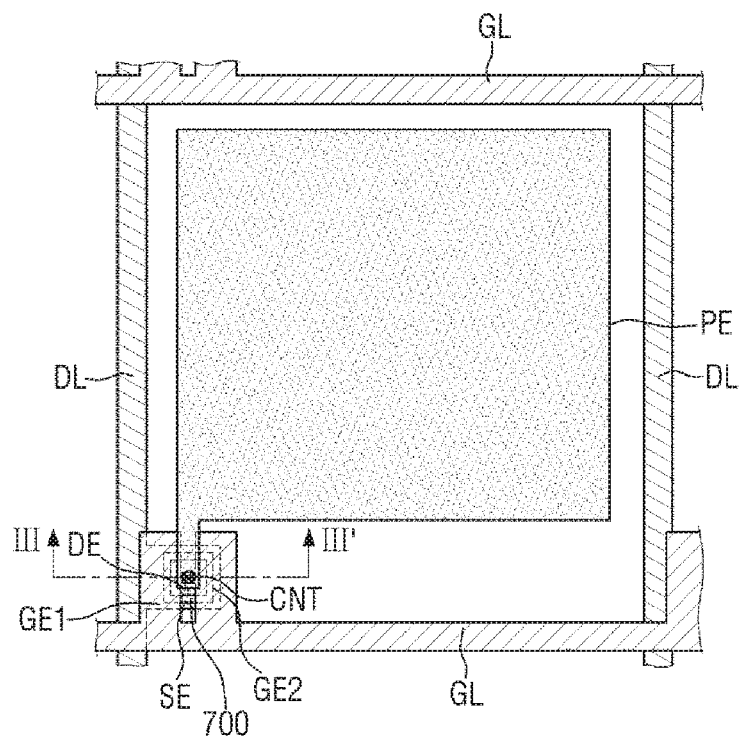
FIG. 5 is a schematic plan view illustrating an array substrate according to another exemplary embodiment of the present inventive concept.
Figure 6:
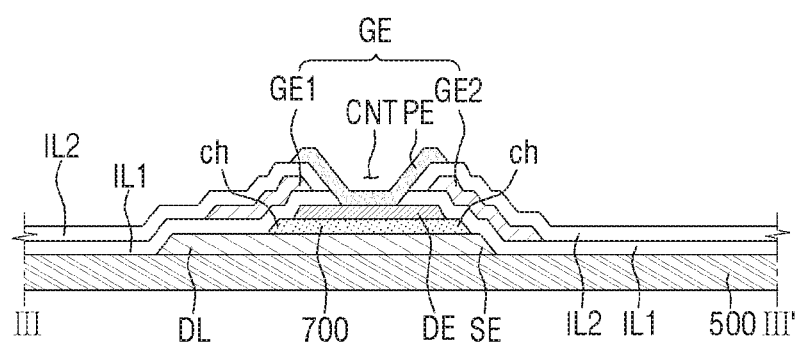
FIG. 6 is a cross-sectional view taken along line of FIG. 5.

FIG. 5 is a schematic plan view illustrating an array substrate AS according to another exemplary embodiment of the present inventive concept. FIG. 6 is a cross-sectional view taken along line of FIG. 5.

Referring to FIG. 5 and FIG. 6, the array substrate AS according to another exemplary embodiment of the present inventive concept differs from the array substrate AS of the exemplary embodiment described with reference to FIG. 2 in that the gate electrode GE of the array substrate AS according to another exemplary embodiment includes a first gate electrode GE1 and a second gate electrode GE2.

For example, the first gate electrode GE1 may be disposed on one side of the drain electrode DE, and the second gate electrode GE2 may be disposed on the other side of the drain electrode DE which is opposite to the one side. The second gate electrode GE2 may have a shape substantially the same as that of the gate electrode GE described with reference to FIG. 2.

Like those described above with reference to FIG. 2, the first gate electrode GE1 and the second gate electrode GE2 may be disposed to be insulated from the drain electrode DE. That is, the first insulation layer IL1 may be interposed between the first gate electrode GE1 and the drain electrode DE, and between the second gate electrode GE2 and the drain electrode DE.

For example, the first gate electrode GE1 and the second gate electrode GE2 may extend in parallel to each other in a plan view. That is, as shown in FIG. 5, the first gate electrode GE1 and the second gate electrode GE2 may be disposed in parallel to each other with the drain electrode DE interposed therebetween.

The first gate electrode GE1 may be disposed relatively adjacent to the data line DL as compared with the second gate electrode GE2, and in an exemplary embodiment, the first gate electrode GE1 may be partially overlapped with the data line DL in a plan view. However, the first gate electrode GE1 may not be overlapped with the data line DL in a plan view.

The first gate electrode GE1 and the second gate electrode GE2 may be overlapped with the drain electrode DE and the source electrode SE in a horizontal direction. When the gate electrode GE is overlapped with the drain electrode DE and the source electrode SE in a horizontal direction, the channel Ch may be formed in the semiconductor pattern layer 700 adjacent to the gate electrode GE, as described above.

When the gate electrode GE includes the first gate electrode GE1 and the second gate electrode GE2, the channel Ch may be formed in both side of the semiconductor pattern layer 700 adjacent to the gate electrode GE as shown in FIG. 5. When the gate electrode GE is formed on both sides of the semiconductor pattern layer 700, a channel width may increase as compared with when the gate electrode GE is formed on only one side of the semiconductor pattern layer 700. Thus, current drivability in a thin film transistor may be improved. That is, when the gate electrode GE is formed on both sides of the semiconductor pattern layer 700, electrical characteristics of the thin film transistor may be improved as compared with when the gate electrode GE is formed on one side of the semiconductor pattern layer 700.

Figure 7:
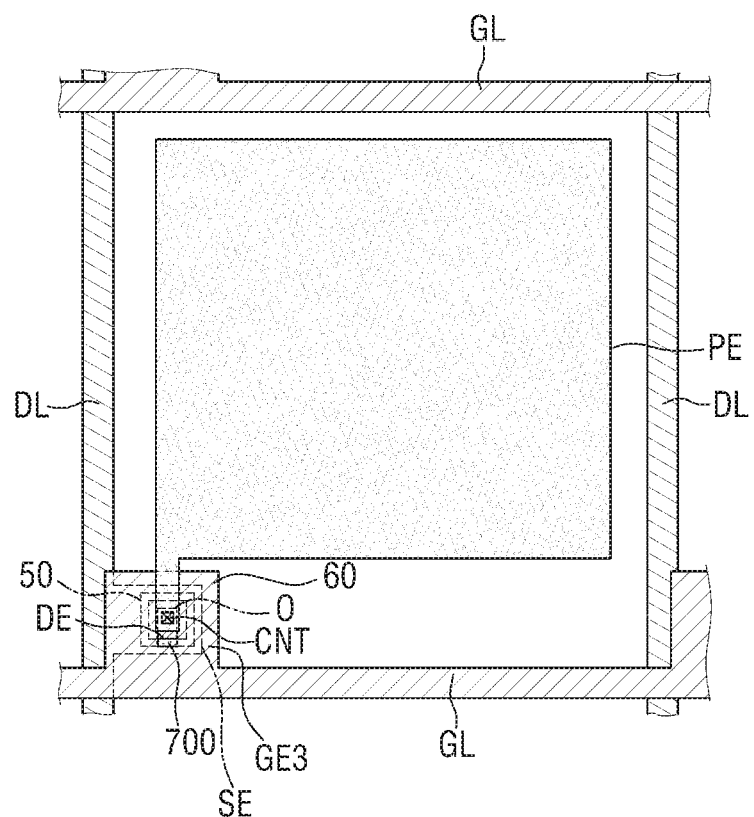
FIG. 7 is a plan view illustrating an array substrate according to still another exemplary embodiment of the present inventive concept.

FIG. 7 is a plan view illustrating an array substrate AS according to still another exemplary embodiment of the present inventive concept.

Referring to FIG. 7, the array substrate AS according to still another exemplary embodiment of the present inventive concept differs from the array substrate AS of the exemplary embodiment described with reference to FIG. 2 in that a gate electrode GE3 has a hollow portion.

The gate electrode GE3 may have a rectangular shape with a hollow portion in the middle of the rectangular shape. In other words, the gate electrode GE3 may include a hollow portion 50 and a rim portion 60 disposed outside the hollow portion 50. In an exemplary embodiment of the present invention, the rim portion 60 of the gate electrode GE3 may be disposed along an outer boundary of the drain electrode DE to overlap the semiconductor pattern layer 700. In another exemplary embodiment of the present invention, the rim portion 60 of the gate electrode GE3 may overlap the outer boundary of the drain electrode DE. The gate electrode GE3 and the drain electrode DE may be electrically insulated by the first insulation layer IL1.

As shown in FIG. 7, the hollow portion 50 of the gate electrode GE3 may be disposed at a center of the gate electrode GE and at least partially expose the upper surface of the drain electrode DE. The contact hole CNT formed through the first insulation layer IL1 and the second insulation layer IL2 may be disposed on the drain electrode DE exposed through the hollow portion 50, and the pixel electrode PE may be disposed on the contact hole CNT. That is, as described above, the pixel electrode PE and the drain electrode DE may be electrically interconnected through the contact hole CNT. The pixel electrode PE may be insulated from the gate electrode GE3 by the second insulation layer IL2, and when the gate electrode GE3 has the hollow portion 50 and is disposed along the outer rim of the drain electrode DE, the pixel electrode PE may include a portion overlapped with the gate electrode GE3 in a plan view The gate electrode GE3 disposed along the outer rim of the drain electrode DE may be overlapped with the semiconductor pattern layer 700 in a horizontal direction. That is, the gate electrode GE3 may be disposed to cover the outer surfaces of the semiconductor pattern layer 700. In this case, the channel Ch of the thin film transistor may be formed in the semiconductor pattern layer 700 adjacent to the gate electrode GE. When the gate electrode GE3 has the hollow portion 50 and is disposed to cover the outer surfaces of the semiconductor pattern layer 700 as shown in FIG. 7, the channel width may be relatively wider as compared with the exemplary embodiments described with reference to FIG. 2 to FIG. 5. Thus, current drivability of the thin film transistor may be relatively improved. That is, when the gate electrode GE3 is disposed to cover the outer surfaces of the semiconductor pattern layer 700, electrical characteristics of the thin film transistor may be improved as compared with when the gate electrode GE3 is formed on one side or both sides of the semiconductor pattern layer 700.

Figure 8:
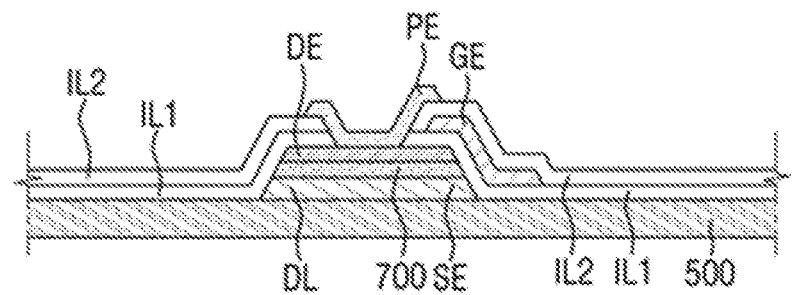
FIG. 8 is a cross-sectional view of the array substrate according to still another exemplary embodiment of the present inventive concept.

FIG. 8 is a cross-sectional view of the array substrate AS according to still another exemplary embodiment of the present inventive concept.

Referring to FIG. 8, the array substrate AS according to still another exemplary embodiment of the present inventive concept differs from the array substrate AS of the exemplary embodiment described with reference to FIG. 3 in that the source electrode SE, the semiconductor pattern layer 700, and the drain electrode DE, which are sequentially stacked, have sidewalls aligned with each other.

The one sidewalls of the source electrode SE, the semiconductor pattern layer 700, and the drain electrode DE, which are sequentially stacked, may be aligned with each other. This alignment may be caused by a method for manufacturing an array substrate AS according to some embodiments of the present inventive concept, which will be described later. For example, this alignment may be achieved by simultaneously or sequentially etching layers for the drain electrode DE, the semiconductor pattern layer 700 and the data line DL including the source electrode SE by using one mask. However, this is merely exemplary, and the scope of the present disclosure is not limited by the manufacturing method mentioned above.

As described above, the gate electrode GE may be disposed on one sides of the source electrode SE, the semiconductor pattern layer 700, and the drain electrode DE. When the one side surface of the source electrode SE, the semiconductor pattern layer 700, and the drain electrode DE are aligned with each other, and the gate electrode GE is disposed adjacent to the one side surface, the distance between the one side surface of the source electrode SE and the gate electrode GE may be substantially the same as the distance between the one side surface of the drain electrode DE and the gate electrode GE. In this case, when turn-on voltage is applied to the gate electrode GE, the channel Ch may be uniformly formed in the one side of the semiconductor pattern layer 700 adjacent to the gate electrode GE and thus the electrical characteristics of the thin film transistor can be stably maintained.

Figure 9:
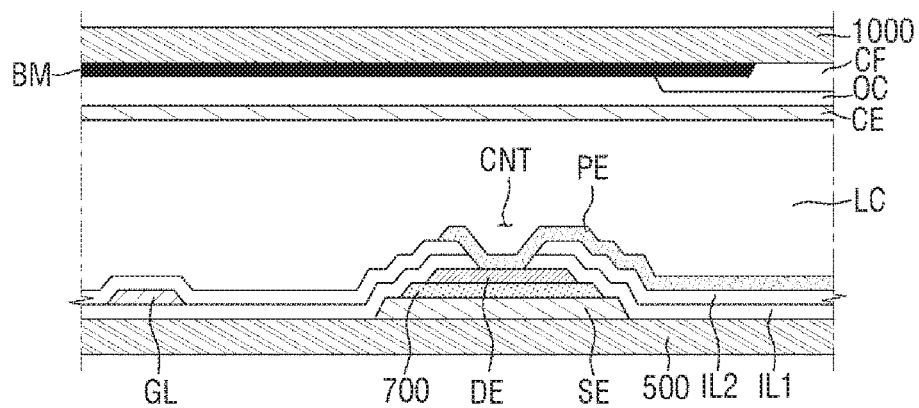
FIG. 9 is a cross-sectional view of a liquid crystal display device according to an exemplary embodiment of the present inventive concept.

FIG. 9 is a cross-sectional view of a liquid crystal display device according to an exemplary embodiment of the present inventive concept. Referring to FIG. 9, the liquid crystal display device according to an exemplary embodiment of the present inventive concept may include the first substrate 500, the source electrode SE disposed on the first substrate 500, the semiconductor pattern layer 700 disposed on the source electrode SE, the drain electrode DE disposed on the semiconductor pattern layer 700, the gate electrode GE disposed on one side surface of the semiconductor pattern layer 700, and the pixel electrode PE disposed on the drain electrode DE; a second substrate 1000 facing the first substrate 500 and a liquid crystal layer LC disposed between the first substrate 500 and the second substrate (1000).

The first substrate 500 including the source electrode SE disposed on the first substrate, the semiconductor pattern layer 700 disposed on the source electrode SE, the drain electrode DE disposed on the semiconductor pattern layer 700, the gate electrode GE disposed on at least one side surface of the semiconductor patter layer 700 so as to be insulated from the drain electrode DE, and the pixel electrode PE disposed on the drain electrode DE may be substantially the same as those of the array substrates according to some embodiments of the present inventive concept described above. Therefore, a detailed description thereof will be omitted.

The second substrate 1000 may be disposed to face the first substrate 500.

The second substrate 1000 may be made of a heat-resistant and light transmitting material. The second substrate 1000 may be made of, for example, transparent glass or plastic, but the present disclosure is not limited thereto.

A black matrix BM and a color filter CF may be disposed on the second substrate 1000. The black matrix BM may serve to suppress light leakage through the pixels and light interference among adjacent pixels. The black matrix BM may be disposed to be overlapped with the source electrode SE, the drain electrode DE, and the semiconductor pattern layer 700 disposed on the first substrate 500. Furthermore, the black matrix BM may cover the data lines DL and/or the gate lines GL.

The color filter CF may be disposed to be overlapped with the pixel electrode PE of each pixel. The color filter CF may include one or more color filters selected from the group consisting of a red color filter, a blue color filter, and a green color filter.

An overcoat layer OC may be disposed on the color filter CF and the black matrix BM. The overcoat layer OC may be made of an organic or inorganic insulation material. The overcoat layer OC may be formed over the whole region of the second substrate 1000, and may function as a planarizing layer.

A common electrode CE may be disposed on the overcoat layer OC. The common electrode CE may be disposed to overlap an area corresponding to the display area DA, for example, a plate shaped which is not patterned. A common voltage may be applied to the common electrode CE. When voltages different from each other are applied to the common electrode CE and the pixel electrode PE, a predetermined electric field is generated between the common electrode CE and the pixel electrode PE, and the orientation of liquid crystals in the liquid crystal layer LC interposed between the first substrate 500 and the second substrate 1000 may be altered by thus-generated electric field.

Figure 10:
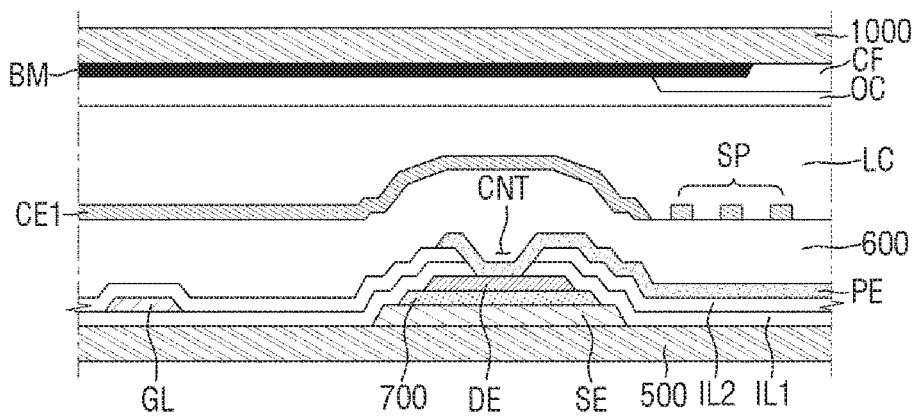
FIG. 10 is a cross-sectional view of a liquid crystal display device according to another exemplary embodiment of the present inventive concept.

FIG. 10 is a cross-sectional view of a liquid crystal display device according to another exemplary embodiment of the present inventive concept.

Referring to FIG. 10, the liquid crystal display device according to another exemplary embodiment of the present inventive concept differs from the liquid crystal display device of the exemplary embodiment described with reference to FIG. 9 in that a common electrode CE1 is formed on the first substrate 500.

That is, the liquid crystal display device according to another exemplary embodiment of the present inventive concept may be an in-plane switching mode liquid crystal display device such as an IPS or a PLS mode liquid crystal display device.

Specifically, a passivation layer 600 as a planarizing layer may be disposed on the pixel electrode PE. The passivation layer 600 may be made of an inorganic insulation material or an organic insulation material.

The common electrode CE1 may be disposed on the passivation layer 600. A common voltage may be applied to the common electrode CE1. Unlike the embodiment described with reference to FIG. 9, a slit pattern SP having a cutout part may be formed on the common electrode CE1. When the common electrode CE1 has the slit pattern SP, a horizontal electric field may be generated between the slit pattern SP in the common electrode CE1 and the pixel electrode PE when different voltages are applied to the common electrode CE1 and the pixel electrode PE. That is, liquid crystals in the liquid crystal layer LC disposed on the common electrode CE1 may be controlled by the horizontal electric field generated between the slit pattern SP in the common electrode CE1 and the pixel electrode PE.

When the common electrode CE1 is formed on the first substrate 500, the black matrix BM, the color filter CF, and the overcoat layer OC may be formed on the second substrate 1000 facing the first substrate. The second substrate 1000 is substantially the same as that described with reference to FIG. 9 except that the common electrode is omitted, and thus a detailed description thereof will be omitted.

Figure 11:
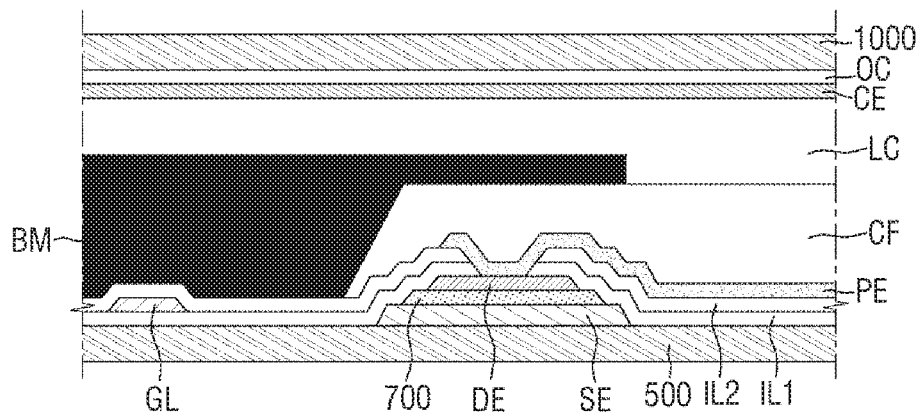
FIG. 11 is a cross-sectional view of a liquid crystal display device according to still another exemplary embodiment of the present inventive concept.

FIG. 11 is a cross-sectional view of a liquid crystal display device according to still another exemplary embodiment of the present inventive concept.

Referring to FIG. 11, the liquid crystal display device according to still another exemplary embodiment of the present inventive concept differs from the liquid crystal display device of the exemplary embodiment described with reference to FIG. 9 in that the black matrix BM and the color filter CF are formed on the first substrate 500.

That is, the liquid crystal display device according to still another exemplary embodiment of the present inventive concept may have a color filter on array (COA) structure.

Specifically, the color filter CF may be disposed on the pixel electrode PE. The color filter CF may be disposed to be overlapped with one pixel electrode PE, and may extend to a portion where a thin film transistor is formed. The black matrix BM may be disposed in the region excluding the portion where the color filter CF is formed. That is, the black matrix BM may extend along the gate line GL and/or the data line DL, and cover the gate line GL and/or the data line DL. Furthermore, the black matrix BM may extend to the portion where the thin film transistor is formed, and at least partially cover the thin film transistor. In this case, the black matrix BM and the color filter CF may be at least partially overlapped with each other in the portion where the thin film transistor is formed.

Although there have been described the array substrates according to some embodiments of the present inventive concept applied to a liquid crystal display device, but the scope of the present disclosure is not limited thereto. That is, although not shown in the drawings, it would be obvious to a person skilled in the art that the array substrates according to some embodiments of the present inventive concept can be applied to an organic light emitting display device.

Hereinafter, a method for manufacturing an array substrate AS according to some embodiments of the present inventive concept will be described. A part of components described below may be substantially the same as the aforementioned components of the array substrates or liquid crystal display devices according to some embodiments of the present inventive concept, and a description of the part of components will be omitted to avoid a duplicated description.

FIG. 12 to FIG. 18 are cross-sectional views illustrating a method for manufacturing an array substrate AS according to an exemplary embodiment of the present inventive concept.

Referring to FIG. 12 to FIG. 18, the method for manufacturing an array substrate AS according to an exemplary embodiment of the present inventive concept may include preparing the first substrate 500 on which the source electrode SE, the semiconductor pattern layer 700, and the drain electrode DE are sequentially stacked in a plan view, disposing the gate electrode GE on at least one side of the semiconductor pattern layer 700 so as to be insulated from the semiconductor pattern layer 700, and forming the pixel electrode PE on the drain electrode DE.

Figure 12:
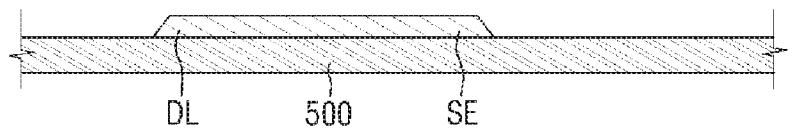
FIGS. 12, 13, 14, 15, 16, 17 and 18 are a cross-sectional view illustrating a method for manufacturing an array substrate according to an exemplary embodiment of the present inventive concept.

Referring first to FIG. 12, the source electrode SE and the data line DL may be formed on the first substrate 500.

The source electrode SE and the data line DL may be simultaneously formed by stacking one or more metal layers and patterning the metal layers. In other words, the data line DL and the source electrode SE may be made of the same material, and integrally formed. The metal layers may be deposited by, for example, a chemical vapor deposition, sputtering or the like. The metal layers may be patterned by an etching process using a photoresist pattern as a mask, that is, a photolithography process and the like.

Figure 13:
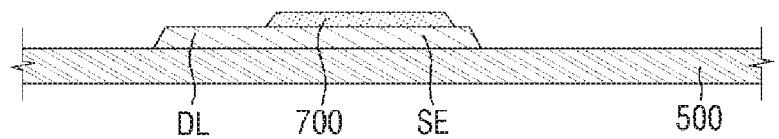

Referring next to FIG. 13, the semiconductor pattern layer 700 may be formed on the source electrode SE. The semiconductor pattern layer 700 may be disposed to be at least partially overlapped with the source electrode SE. The semiconductor pattern layer 700 may be formed by depositing a semiconductor layer over the whole surface of the source electrode SE, and patterning the semiconductor layer. The patterning may be performed by dry or wet etching the semiconductor layer by using a photoresist pattern as a mask.

For example, an ohmic contact layer (not shown) may be formed on the semiconductor pattern layer 700. Furthermore, the semiconductor pattern layer 700 may be an oxide semiconductor as described above in other exemplary embodiments.

Figure 14:
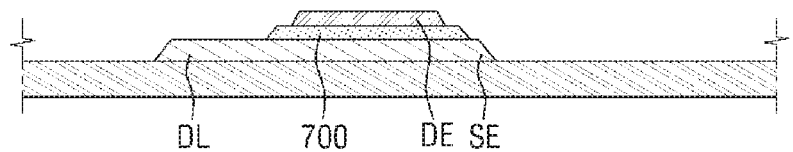

Referring next to FIG. 14, the drain electrode DE may be formed on the semiconductor pattern layer 700.

The drain electrode DE may be formed by stacking one or more metal layers and patterning the metal layers. The metal layers may be deposited by, for example, a chemical vapor deposition, sputtering or the like. The metal layers may be patterned by an etching process using a photoresist pattern as a mask, that is, a photolithography process and the like.

For example, the drain electrode DE may be made of a material substantially the same as that of the source electrode SE. However, the present disclosure is not limited thereto, and the drain electrode DE and the source electrode SE may be made of materials different from each other.

The drain electrode DE may be formed to have an island shape. For example, the drain electrode may be formed to be completely overlapped with the semiconductor pattern layer 700. In other words, the outer wall of the drain electrode DE may be disposed inwardly relative to the outer side surface of the semiconductor pattern layer 700.

Thus, the source electrode SE, the semiconductor pattern layer 700, and the drain electrode DE may be sequentially stacked in a plan view. Furthermore, the source electrode SE, the semiconductor pattern layer 700, and the drain electrode DE may be at least partially overlapped in a plan view.

Figure 15:
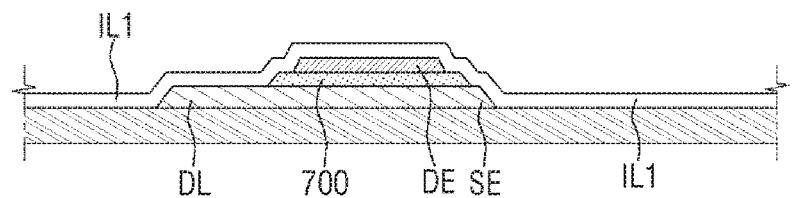

Referring next to FIG. 15, the first insulation layer IL1 may be formed on the data line DL, the source electrode SE, the semiconductor pattern layer 700, and the drain electrode DE so as to cover the data line DL, the source electrode SE, the semiconductor pattern layer 700, and the drain electrode DE. The first insulation layer IL1 may be made of one or more materials selected from the group consisting of an inorganic insulation material such as silicon oxide (SiOx) or silicon nitride (SiNx), and an organic insulation material such as benzocyclobutene (BCB), an acrylic material, and polyimide.

Figure 16:
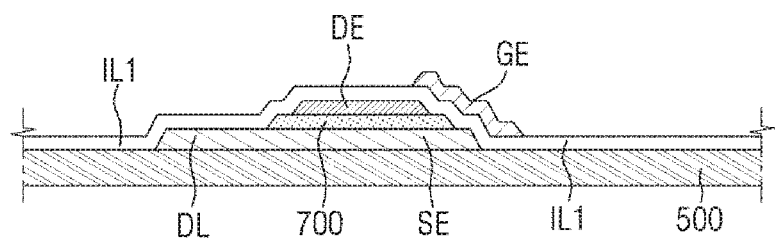

Referring next to FIG. 16, the gate electrode GE may be formed on the first insulation layer IL1. The gate electrode GE may be formed to be disposed on at least one side of the drain electrode DE. In other words, the gate electrode GE may be formed to be disposed on one side surface of the source electrode SE, the semiconductor pattern layer 700, and the drain electrode DE. That is, the gate electrode GE may be disposed to be overlapped with the source electrode SE, the semiconductor pattern layer 700, and the drain electrode DE in a horizontal direction.

The gate electrode GE may be insulated from the source electrode SE, the semiconductor pattern layer 700, and the drain electrode DE by the first insulation layer IL1.

Figure 17:
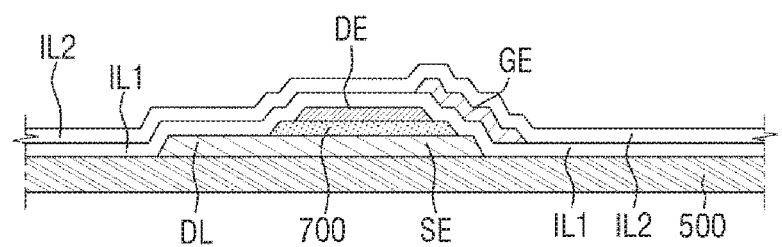

Referring next to FIG. 17, the second insulation layer IL2 may be formed on the first insulation layer IL1 and the gate electrode GE. The second insulation layer IL2 may be made of one or more materials selected from the group consisting of an inorganic insulation material such as silicon oxide (SiOx) or silicon nitride (SiNx), and an organic insulation material such as benzocyclobutene (BCB), an acrylic material, and polyimide.

For example, the second insulation layer IL2 may be made of a material substantially the same as that of the first insulation layer IL1. However, the present disclosure is not limited thereto, and the second insulation layer IL2 and the first insulation layer IL1 may be made of materials different from each other.

Figure 18:
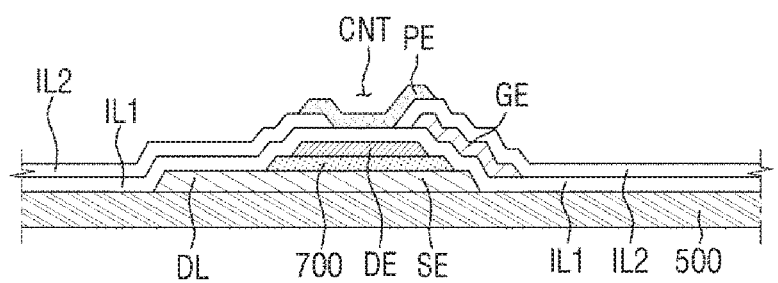

Referring next to FIG. 18, the contact hole CNT may be formed through the first insulation layer IL1 and the second insulation layer IL2.

The contact hole CNT may formed through the first insulation layer IL1 and the second insulation layer IL2 so as to expose at least a part of the upper surface of the drain electrode DE.

Subsequently, the pixel electrode PE may be formed on the drain electrode DE. The pixel electrode PE may be partially overlapped with the drain electrode DE, the source electrode SE, and the semiconductor pattern layer 700. The pixel electrode PE may be electrically connected to the drain electrode DE through the contact hole CNT, but insulated from the gate electrode GE by the second insulation layer IL2.

Hereinafter, a method for manufacturing an array substrate AS according to another embodiment of the present inventive concept will be described. A part of components described below may be the same as the aforementioned components of the liquid crystal display devices according to some embodiments of the present inventive concept, and a description of the part of components will be omitted to avoid a duplicated description.

Figure 19:
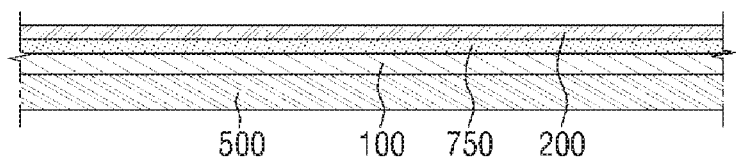
FIGS. 19 and 20 are a cross-sectional view illustrating a method for manufacturing an array substrate according to another exemplary embodiment of the present inventive concept.
Figure 20:
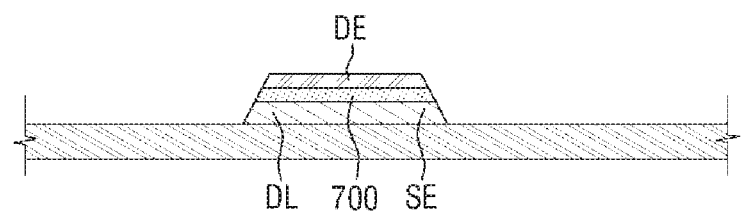

FIG. 19 and FIG. 20 are cross-sectional views illustrating a method for manufacturing an array substrate AS according to another exemplary embodiment of the present inventive concept.

Referring to FIG. 19 and FIG. 20, preparing the first substrate 500 on which the source electrode SE, the semiconductor pattern layer 700, and the drain electrode DE are sequentially stacked in a plan view may include sequentially stacking a first metal layer 100, a semiconductor layer 750, and a second metal layer 200, and etching and patterning the first metal layer 100, the semiconductor layer 750, and the second metal layer 200 by using one mask.

Referring first to FIG. 19, the first metal layer 100 may be formed over the whole surface of the first substrate 500. The first metal layer 100 may be patterned to form the data line DL and the source electrode SE. Thus, the first metal layer 100 may be made of a material substantially the same as the materials of the data line DL and the source electrode SE of the array substrates according to some embodiments of the present inventive concept.

Subsequently, the semiconductor layer 750 may be formed over the whole surface of the first metal layer 100. The semiconductor layer 750 may be patterned to form the semiconductor pattern layer 700. Thus, the semiconductor layer 750 may be made of a material substantially the same as the material of the semiconductor pattern layer 700 of the array substrates according to some embodiments of the present inventive concept.

Subsequently, the second metal layer 200 may be formed over the whole surface of the semiconductor layer 750. The second metal layer 200 may be patterned to form the drain electrode DE. Thus, the second metal layer 200 may be made of a material substantially the same as the material of the drain electrode DE of the array substrates according to some embodiments of the present inventive concept.

Referring next to FIG. 20, the first metal layer 100, the semiconductor layer 750, and the second metal layer 200 may be etched by using one mask.

Specifically, the first metal layer 100, the semiconductor layer 750, and the second metal layer 200 may be etched by using one mask so as to form the source electrode SE, the semiconductor pattern layer 700, and the drain electrode DE, which are stacked in a plan view.

For example, the first metal layer 100, the semiconductor layer 750, and the second metal layer 200 may be etched in a batch-type wet etcher using one mask. That is, the first metal layer 100, the semiconductor layer 750, and the second metal layer 200 may be etched simultaneously or sequentially by the same etchant. However, the first metal layer 100, the semiconductor layer 750, and the second metal layer 200 may be etched simultaneously or sequentially by different etchants.

For another example, one mask is used but the first metal layer 100 and the second metal layer 200 may be wet etched while the semiconductor layer 750 may be dry etched. That is, wet etching, dry etching, and wet etching can be sequentially performed in a process employing only one mask.

When the first metal layer 100, the semiconductor layer 750, and the second metal layer 200 are etched by one mask so as to form the source electrode SE, the semiconductor pattern layer 700, and the drain electrode DE, which are stacked in a plan view, at least one sidewall of the source electrode SE, the semiconductor pattern layer 700, and the drain electrode DE may be aligned with each other. Thus, a thin film transistor may have electrical stability as described above.

While the present inventive concept has been particularly shown and described with reference to exemplary embodiments thereof, it will be understood by those of ordinary skill in the art that various changes in a form may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. An array substrate comprising:
    a first substrate including a display area and a non-display area defined on the first substrate;
    a gate line disposed on the first substrate and extending along a first direction;
    a plurality of pixels disposed on the display area and connected to the gate line, each of the plurality of pixels including:
        a source electrode disposed on the first substrate;
        a semiconductor pattern layer disposed on the source electrode;
        a drain electrode disposed on the semiconductor pattern layer;
        a pixel electrode disposed on the drain electrode and having a portion directly contacting the drain electrode; and
        a gate electrode which is not electrically connected to any one of the source electrode and the drain electrode, and protrudes from the gate line along a second direction substantially perpendicular to the first direction into the display area,
    wherein the portion of the pixel electrode directly contacting the drain electrode overlaps the source electrode, the semiconductor pattern layer and the drain electrode in a plan view,
    wherein the gate electrode includes a hollow portion and a rim portion surrounding the hollow portion, and the rim portion completely overlaps an outer rim of the drain electrode in a plan view, and
    wherein any portion of the gate line does not directly contact the source electrode.

2. The array substrate of claim 1, wherein the source electrode, the semiconductor pattern layer, and the drain electrode are overlapped in a plan view.

3. The array substrate of claim 1, wherein the gate electrode is overlapped with the source electrode, the semiconductor pattern layer, and the drain electrode in a horizontal direction.

4. The array substrate of claim 1, wherein the semiconductor pattern layer includes an oxide semiconductor.

5. The array substrate of claim 1, further comprising a channel which electrically interconnects the source electrode and the drain electrode, wherein the channel is formed in the semiconductor pattern layer adjacent to the gate electrode.

6. The array substrate of claim 1, wherein a bottom end of the gate electrode is disposed below an upper surface of the source electrode, and a top end of the gate electrode is disposed above a lower surface of the drain electrode.

7. The array substrate of claim 1, further comprising a first insulation layer which covers the source electrode, the semiconductor pattern layer, and the drain electrode, and a thickness of the first insulation layer is thinner than a thickness of the source electrode.

8. The array substrate of claim 1, further comprising a second gate electrode, the second gate electrode being disposed on the other side of the semiconductor pattern layer.

9. The array substrate of claim 1, wherein a first insulation layer and a second insulation layer at least partially exposing a surface of the drain electrode are disposed on the drain electrode,
    wherein the pixel electrode is disposed on the second insulation layer and contacts the exposed surface of the drain electrode, and
    wherein the gate line and the gate electrode are disposed between the first insulation layer and the second insulation layer.

10. The array substrate of claim 1, wherein a portion of the pixel electrode and the rim portion of the gate electrode are overlapped with each other in a plan view.

11. The array substrate of claim 1, wherein one sidewall of the source electrode, the semiconductor pattern layer, and the drain electrode is aligned with each other.

* * * * *